US008754799B2

(12) United States Patent
Coln et al.

(10) Patent No.: US 8,754,799 B2
(45) Date of Patent: Jun. 17, 2014

(54) CORRELATED DOUBLE-SAMPLE DIFFERENCING WITHIN AN ADC

(75) Inventors: Michael Coln, Lexington, MA (US); Gary Carreau, Plaistow, NH (US); Yoshinori Kusuda, San Jose, CA (US)

(73) Assignee: Analog Devices, Inc., Norwood, MA (US)

( * ) Notice: Subject to any disclaimer, the term of this patent is extended or adjusted under 35 U.S.C. 154(b) by 35 days.

(21) Appl. No.: 13/565,082

(22) Filed: Aug. 2, 2012

(65) Prior Publication Data

US 2013/0194118 A1    Aug. 1, 2013

Related U.S. Application Data

(60) Provisional application No. 61/591,335, filed on Jan. 27, 2012.

(51) Int. Cl.
*H03M 1/38* (2006.01)
*H03M 1/12* (2006.01)
*H04N 5/357* (2011.01)

(52) U.S. Cl.
CPC .............. *H03M 1/124* (2013.01); *H04N 5/3575* (2013.01); *H03M 1/12* (2013.01)
USPC ............ 341/163; 341/172; 348/241; 348/308

(58) Field of Classification Search
USPC ................. 341/141, 155, 161, 162, 163, 172; 348/241, 243, 257, 294–297, 308
See application file for complete search history.

(56) References Cited

U.S. PATENT DOCUMENTS

| | | | |
|---|---|---|---|
| 5,793,322 A * | 8/1998 | Fossum et al. | 341/161 |
| 5,880,691 A * | 3/1999 | Fossum et al. | 341/162 |
| 6,222,175 B1 * | 4/2001 | Krymski | 250/208.1 |
| 6,476,864 B1 * | 11/2002 | Borg et al. | 348/245 |
| 6,829,007 B1 * | 12/2004 | Bilhan et al. | 348/243 |
| 7,746,521 B2 * | 6/2010 | Lee | 358/482 |
| 7,834,798 B2 * | 11/2010 | Mizoguchi et al. | 341/172 |
| 8,072,360 B2 * | 12/2011 | Byrne et al. | 341/118 |
| 2002/0101528 A1 * | 8/2002 | Lee et al. | 348/304 |
| 2009/0091648 A1 * | 4/2009 | Lin et al. | 348/301 |
| 2009/0103827 A1 * | 4/2009 | Ladd et al. | 382/260 |
| 2010/0007775 A1 * | 1/2010 | Wang et al. | 348/241 |
| 2012/0025062 A1 * | 2/2012 | Neubauer et al. | 250/208.1 |

OTHER PUBLICATIONS

Markatani et al. A Successive-Approximation ADC for CMOS Image Sensors, IEEE 2011 International Conference on Multimedia Computing and Systems (ICMCS 2011), Apr. 2011.*

* cited by examiner

*Primary Examiner* — Howard Williams
(74) *Attorney, Agent, or Firm* — Kenyon & Kenyon LLP (57) ABSTRACT

A circuit system for performing correlated double sampling may include a signal sampling stage having an amplifier with a feedback capacitor and a pair of storage capacitors coupled to an output of the amplifier, and a differential analog to digital converter (ADC) having a pair of inputs coupled respectively to storage capacitors of the signal sampling stage. The signal sampling stage may receive reset and signal values from a sensor device and may store processed versions of those signals on respective storage capacitors. The differential ADC may generate a digital value representing a signal captured by the sensor device from a differential digitization operation performed on the processed versions of the reset and signal values. In this manner, the system may correct for any signal errors introduced by components of the sampling stage.

17 Claims, 6 Drawing Sheets

CORRELATED DOUBLE-SAMPLE DIFFERENCING WITHIN AN ADC

The present invention benefits from priority afforded by U.S. patent application Ser. No. 61/591,335, entitled "Correlated Double-Sample Differencing within an ADC," filed Jan. 27, 2012, the disclosure of which is incorporated herein in its entirety.

BACKGROUND

The present invention relates to sensor processing, in particular image sensor processing.

Sensor data is typically a voltage or current signal that varies proportionally to a monitored property of a test subject (e.g., light, x-rays, etc.). One technique for measuring sensor signals is correlated double sampling ("CDS"), which effectively extracts desired signals in the presence of signal disturbances that may arise due to internal offset errors of a sensor circuit. In a CDS scheme, outputs from a sensor circuit are measured twice. The signal is measured first when the sensor circuit is set to a known condition without sensor content (e.g., a "reset" condition). The signal is measured again when the sensor circuit has reached an unknown condition with sensor content (e.g., sensor reading). The difference of the two values generally corresponds to the monitored property of the sensor.

Figure 1:
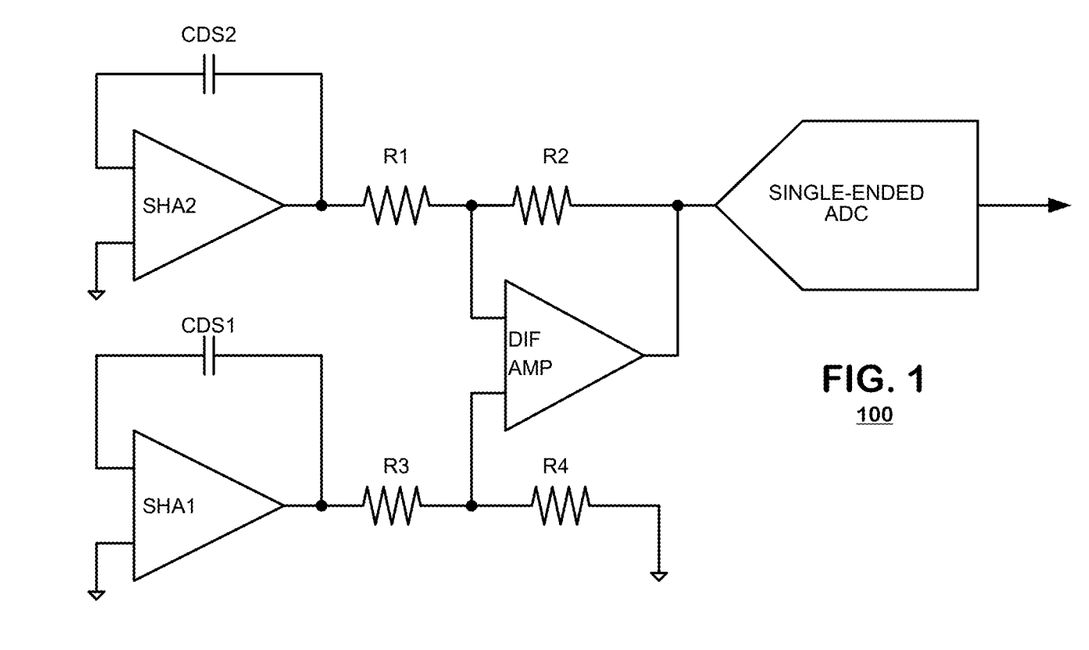
FIG. 1 illustrates a traditional CDS structure.

CDS differencing, which is the subtraction of the two measured values, traditionally is performed by a differencing amplifier. FIG. 1 illustrates a traditional CDS structure. In FIG. 1, CDS1 and CDS2 capacitors store the respective first and second measured values. Each capacitor is coupled to a respective sample and hold amplifier SHA1, SHA2. The outputs of the SHA are coupled to a differencing amplifier via a resistor network (R1-R4). The differencing amplifier subtracts the measured values and amplifies the difference. A single-ended ADC (or a ground referenced ADC) then converts the difference to a digital value. The differencing amplifier, however, consumes significant area and power while adding noise and distortion to the process, which is not addressed by the CDS operation. Furthermore, the single ended ADC can also suffer from additional internal offsets.

DETAILED DESCRIPTION

Embodiments of the present invention provide a sensor processing architecture that may perform a CDS differencing operation concurrently with an analog-to-digital conversion. Embodiments of the present invention may utilize a differential input ADC to sample a first CDS input at a first input terminal and a second CDS input at a second input terminal. Consequently, the ADC may perform the CDS differencing operation as it digitizes the input signals. Therefore, the embodiments provide a space and power efficiency while mitigating noise and distortion as compared to conventional CDS systems.

Other embodiments of the present invention may also provide a programmable reference driving voltage, which may further optimize sensor processing architecture functionality. The reference driving voltage may minimize distortion effects caused by the use of thin film transistors (TFTs) in a coupled pixel array. The reference driving voltage may be programmed according to the TFTs characteristics and may be used in a sampling and converting stage.

Figure 2:
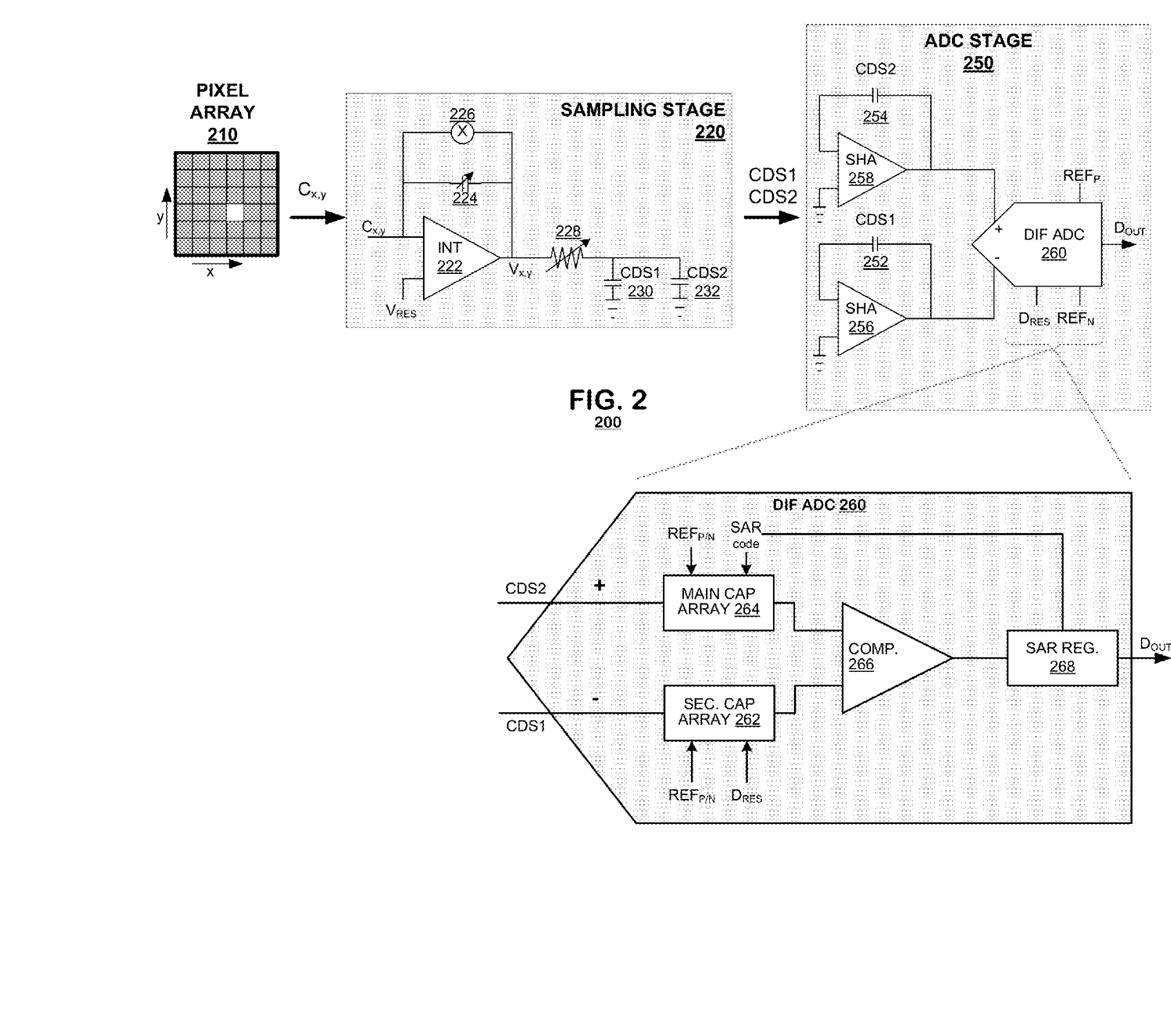
FIG. 2 is a system diagram illustrating a sensor processing system according to an embodiment of the present invention.

FIG. 2 is a sensor processing system 200 according to an embodiment of the present invention. The system 200 may include a variety of circuit systems including a pixel array 210, a sampling stage 220 and an ADC stage 250. The pixel array 210 may include a plurality of pixel circuits (not shown) arranged in an ordered array. Pixel circuits within the array may generate output signals that represent radiation incident upon detectors(s) of the circuits, for example, visible light or x-ray radiation. When one of the pixels is selected, it may output reset and signal charges separately to the sampling stage 220. The sampling stage 220 may generate output voltages CDS1, CDS2 for use by the ADC stage 250 in digital conversion. The ADC stage 250 may generate a digital output code $D_{OUT}$ representing a signal level of incident radiation to the pixel circuit and, in so doing, may perform the correlated double sampling operation.

As indicated, the pixel array 210 may include a plurality of pixel elements that generate an electrical output in response to incident energy (e.g., light, x-rays, etc.). Pixel circuits may be organized into a regular array of addressable pixel circuits, for example, a Cartesian or hexagonal grid. For purposes of the present discussion, it is convenient to consider the arrays as including a variety of pixels in columns and rows. Each pixel p(x,y) may include thin film transistor ("TFT") components that may generate a charge when excited by incident radiation. For example, x-rays illuminating on a pixel p(x,y) may generate the charge $C_{x,y}$. The amount of illumination may cause a corresponding variation in output charge (i.e., increasing illumination leads to increasing charge). When a pixel p(x,y) is addressed, it may output its charge $C_{x,y}$ to the sampling stage 220. During operation, a selected pixel p(x,y) may be addressed twice—once immediately after the pixel is reset to output a reset level and a second time after an exposure period to output the signal level.

In an embodiment, the pixel array 210 may be provided on a substrate separate from other components (e.g., sampling stage 220 and ADC stage 250). Such an implementation may be appropriate for an X-ray sensor system. The sampling stage 220 and ADC stage 250 may be provided in a common integrated circuit (IC) to each other. Alternatively, in another embodiment, the pixel array 210 may be provided on a common IC substrate as other components, which may be appropriate in a digital camera embodiment.

The sampling stage 220 may include an integrator 222, integrating capacitor 224, reset switch 226, an optional output resistor 228 and sampling capacitors 230, 232. The integrator 222 may have an input coupled to the pixel array 210 and a second input coupled to a resetting voltage $V_{RES}$. The integrating capacitor 224 may be coupled to an output and an input of the integrator 222 in feedback configuration. The reset switch 226 may be connected across the integrating capacitor 224 to reset it. The integrating capacitor 224 may be provided as a variable capacitor to provide programmable gain control. The output resistor 228 may be coupled between an output of the integrator 222 and first terminals of the storage capacitors 230, 232. Second terminals of the storage capacitors 230, 232 may be connected to ground. The first terminals of the storage capacitors 230, 232 may be connected to an output of the sampling stage 220.

The sampling stage 220 may receive input charges $C_{x,y}$ from the pixel array 210 at different times for correlated double sampling and may sample/accumulate the charge to generate a corresponding input voltage $V_{x,y}$. The samples may be stored as CDS1 and CDS2 on the capacitors 230, 232. CDS1 may correspond to a sampling time of known conditions (e.g., reset time), and CDS2 may correspond to a sampling time of unknown conditions (e.g., sensor reading).

The storage capacitors 230, 232 may store the accumulated voltage for samples CDS1 and CDS2 respectively. Typically, the storage capacitors 230, 232 will have common capacitances. Sampling switches (not shown) may connect the capacitors 230, 232 to the output resistor 228 at appropriate times to capture the CDS1, CDS2 voltages on the respective capacitors. In an embodiment, an output resistor 228 may be provided that, working in conjunction with capacitance of the storage capacitors 230, 232, may form RC filters to reduce high-frequency noise. The resistor 228 may be provided as a variable resistor that may be programmed at run time to balance fast settling versus low noise advantages.

The sampling stage 220 may receive the input charge $C_{x,y}$ and may sample/accumulate the charge to generate a corresponding input voltage $V_{x,y}$ twice at different times for correlated double sampling. The samples may be stored as CDS1 and CDS2. CDS1 may correspond to a sampling time of known conditions (e.g., reset time), and CDS2 may correspond to a sampling time of unknown conditions (e.g., sensor reading).

In an embodiment, the ADC stage 250 may include a pair of capacitors 252, 254, a pair of sample and hold amplifiers ("SHA") 256, 258 and a differential ADC 260. The capacitors 252, 254 each may be provided in feedback configuration about a respective SHA 256, 258. The ADC stage 250 may receive the CDS 1 and CDS2 samples from the sampling phase 220 and may convert the difference between the samples, ΔCDS, directly to a digital value in a single conversion operation. The SHAs 256, 258 may buffer CDS1 and CDS2 voltages that are output respectively from the sampling stage 220. A pair of storage capacitors 252, 254 respectively may store the samples CDS1 and CDS2. In an embodiment, the ADC stage storage capacitors 252, 254 and the sampling stage storage capacitors 230, 232 may be provided as common devices.

The input voltage $V_{x,y}$ from the pixel array 210 may vary over several phases of operation. In a first phase, $V_{x,y}$ may be at a reset level representing a voltage of a pixel prior to exposure to incident energy. In another phase, $V_{x,y}$ may be at signal level representing a voltage of the same pixel after having been exposed to incident energy. Other phases may be required to address different pixels within the array.

In an ideal case, the reset values of all pixels would match a common reference voltage. In practice, however, device mismatches and other variations within the pixel array 210 may cause pixel-to-pixel variations among the reset values of the different pixels. Such variations also would cause pixel-to-pixel variations among the signal values of the pixels if the pixels received common levels of incident energy. Manufacturing variations among components in the signal chain from the pixel array 210 through to inputs of a differential ADC 260 of the ADC stage 250 also may contribute signal mismatch between the reset and signal values.

FIG. 2 also illustrates structure of a differential ADC 260 in an embodiment of the present invention. The differential ADC 260 may receive the CDS1 voltage from the SHA 256 at a first input terminal (e.g., a negative terminal) and may receive the CDS2 voltage from the CDS2 voltage from the SHA 258 at another input terminal (e.g., a positive terminal). The differential ADC 260 may generate a digital output code in response to a difference between the CDS1 and CDS2 voltages.

The differential ADC 260 may be provided as a successive approximation register (SAR) ADC and therefore, may include a secondary capacitor array 262, a main capacitor array 264, a comparator 266 and a SAR register 268. The secondary capacitor array 262 may be connected to the first SHA 256 to receive the CDS1 signal. The main capacitor array 264 may be connected to the second SHA 258 to receive the CDS2 signal. Each of the capacitor arrays 262, 264 may include an array of binary weighted capacitors with switch controls (not shown) to include or exclude the capacitors from contributing to an output voltage from the respective array. Switches of the main capacitor array 264 may be controlled by an SAR code control signal stored by the SAR register 268. Switches of the secondary capacitor array 262 may be controlled by a $D_{RES}$ control signal that may correspond to the resetting voltage. The capacitor arrays 262, 264 also may receive reference voltages $REF_N$ and $REF_P$, which may correspond to the operating range of the ADC 260. For example, $REF_N$ may correspond to the lower end (e.g., 0.5 V) and REF may correspond to the upper end (e.g., 4.5 V) of the operating range.

The comparator 266 may generate digital output signals in response to voltages presented at its inputs by the main and secondary capacitor arrays 264, 262. The SAR register 268 may assemble a digital code from the comparator's outputs. Contents of the SAR register 268 (SAR code) may be fed back to the main capacitor array 264 as switch control signals as the differential ADC 260 cycles through bitwise trials.

The differential ADC 260 may operate on a bitwise trial and error basis that searches through candidate quantization levels of the input signal and converges upon a digital output $D_{OUT}$. For a given bit trial, control switches within the main capacitor array 264 may be set according to any previous bit trials (shown as the SAR code signal) and control switches in the secondary capacitor array 262 may be set according to the $D_{RES}$ signal. The control signals SAR code and $D_{RES}$ may cause the main and secondary capacitor arrays 264, 262 to output voltages to the comparator 266. The results of each bit trial as provided by the comparator 266 may be stored in the SAR register 268 and may be used to set switch values in the main capacitor array 264 for a subsequent bit trial. The bit trials may be performed iteratively until all bit positions are resolved. The bit trial results may be combined to generate a digital output $D_{OUT}$. $D_{OUT}$ may be a digital representation of the difference of the CDS voltages, ΔCDS. Hence, the differential ADC 260 may operate in a balanced fashion (typically, the CDS voltages are close in values) to provide CDS differencing that provides improved common mode and reference noise rejection.

The architecture of FIG. 2, by performing CDS1 to CDS2 comparisons within the ADC, provides an architecture that rejects offsets induced by common path components. As indicated, component variations among the pixel circuits can cause pixel-to-pixel variations in the reset and signal levels that are generated by the pixel array. Further, component variations within the integrator 222 or feedback capacitor 224 can induce signal offsets in the reset and signal levels. The architecture of FIG. 2, by integrating the CDS operation with digitization, rejects signal corruptions that might affect the CDS1 and CDS2 in common.

Figure 3:
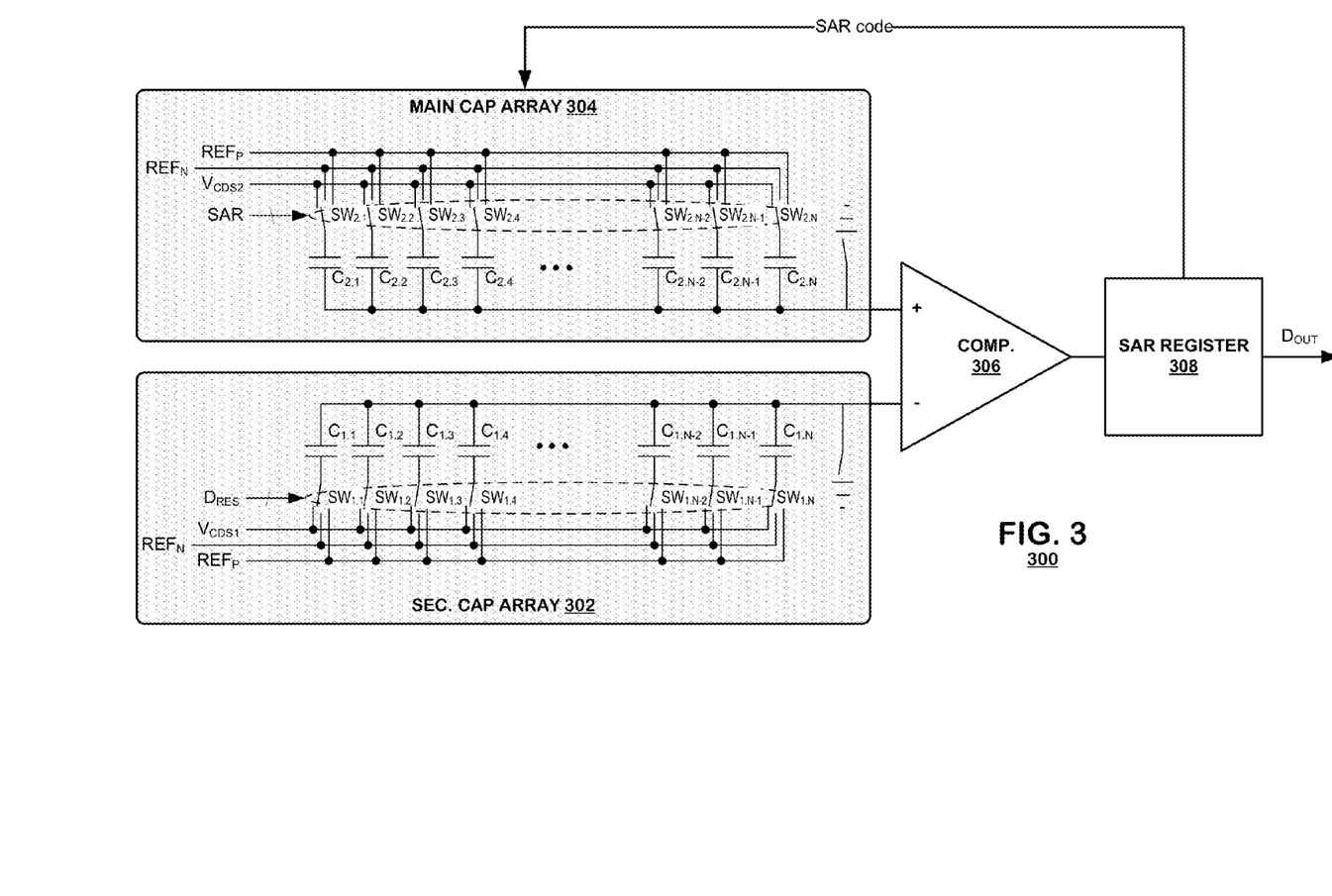
FIG. 3 is a diagram illustrating a successive approximation register analog to digital converter according to an embodiment of the present invention.

FIG. 3 is a simplified block diagram of a SAR ADC 300 according to an embodiment of the present invention. The SAR ADC 300 may include a pair of capacitor arrays 302, 304, a comparator 306 and a SAR register 308. A secondary capacitor array 302 may include a set of binary weighted capacitors $C_{1.1}$-$C_{1.N}$ having first terminals (called "output" terminals, for convenience) coupled to a common output of the secondary capacitor array 302. Second terminals ("input" terminals) of the capacitors $C_{1.1}$-$C_{1.N}$ may be coupled to a variety of voltage sources via respective switches $SW_{1.1}$-$SW_{1.N}$. The voltage sources may include CDS1, the voltage input to the SAR ADC 300 from a prior stage, and reference voltages $REF_N$ and $REF_P$, which may define the operating range of the ADC 300. As indicated, $REF_N$ may correspond to the lower end (say, 0.5 V) and REF may correspond to the upper end (say, 4.5 V) of the ADC's operating range. The switches SW1.1-SW1.N may be controlled by respective bit positions of a control signal $D_{RES}$.

A main capacitor array 304 may include a set of binary weighted capacitors $C_{2.1}$-$C_{2.N}$ having first terminals ("output" terminals) coupled to a common output of the main capacitor array 304. Second terminals ("input" terminals) of the capacitors $C_{2.1}$-$C_{2.N}$ may be coupled to a variety of voltage sources via respective switches $SW_{2.1}$-$SW_{2.N}$. The voltage sources may include CDS2, the voltage input to the SAR ADC 300 from a prior stage, and the reference voltages $REF_N$ and $REF_P$, that are input to the secondary capacitor array 302. The switches $SW_{2.1}$-$SW_{2.N}$ may be controlled by respective bit positions of a SAR code control signal output from the SAR register 308, which may vary in correspondence with bit trials as the SAR ADC 300 performs them.

As in the prior embodiment, the comparator 306 may be a one bit comparator used in each bit trial. The SAR register 308 may store bit values output from the comparator 306 at each bit trial to build up a multi-bit code. During operation, the comparator's bit decisions may be stored at respective bit positions of the SAR ADC's output code $D_{OUT}$. The control signal SAR code also may be revised as the comparator's bit decisions build up the output code $D_{OUT}$.

Figure 4:
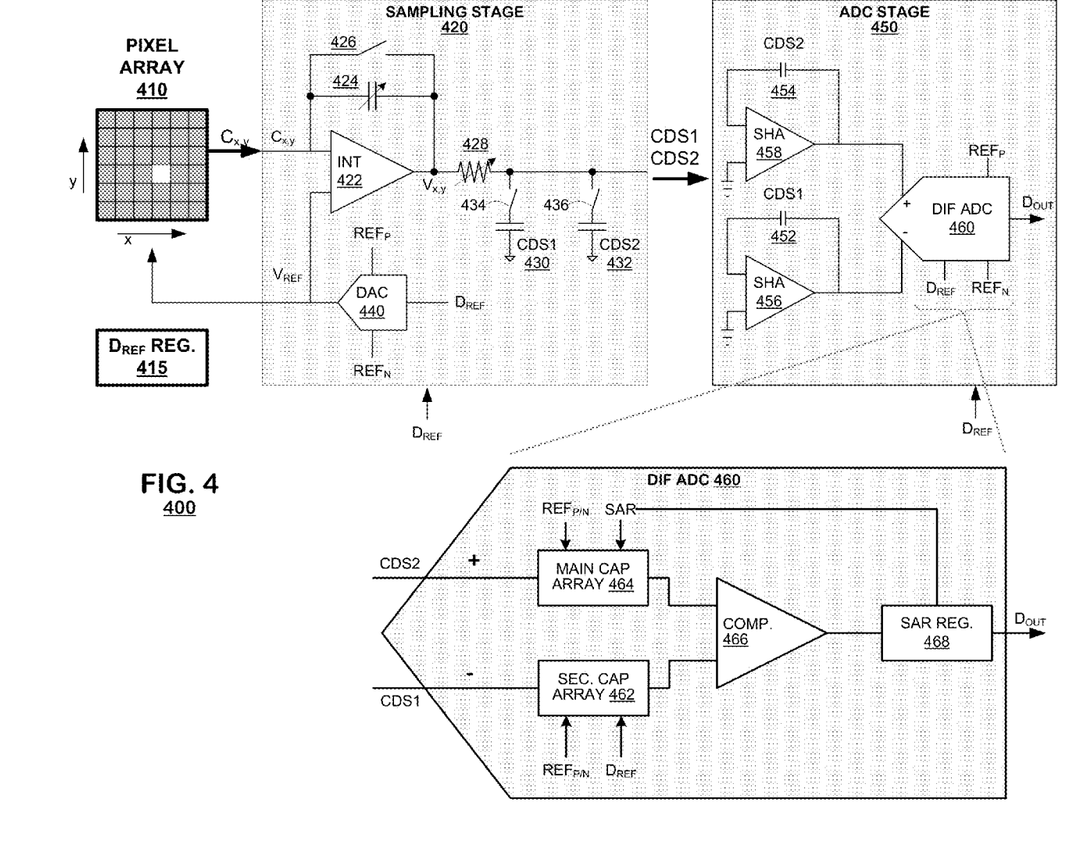
FIG. 4 is a diagram illustrating a sensor processing system according to another embodiment of the present invention.

FIG. 4 is a sensor processing system 400 according to an embodiment of the present invention. The system 400 may include a variety of circuit systems including a pixel array 410, a $D_{REF}$ register 415, a sampling stage 420 and an ADC stage 450. The pixel array 410 may include a plurality of pixel circuits (not shown) arranged in an ordered array. The pixel circuits may generate output signals that represent radiation incident upon detectors(s) of the pixels, for example, visible light or x-ray radiation. When one of the pixels is selected, it may output reset and signal values separately (shown as charges $C_{x,y}$ in FIG. 4) to the sampling stage 420. The sampling stage 420 may generate output voltages CDS1, CDS2 from the reset and signal values for use by the ADC stage 450 in digital conversion. The ADC stage 450 may generate a digital output code $D_{OUT}$ representing a signal level of incident radiation to the pixel circuit and, in so doing, may perform the correlated double sampling operation.

The $D_{REF}$ register 415 may be a programmable register that stores a digital control signal representing a $D_{RES}$ voltage. The $D_{REF}$ value may be selected based on a type of pixel array 410 (e.g., TFT type) to which the rest of the system, the sampling stage 420 and ADC stage 450, are connected. The $D_{REF}$ register 415 may be pre-programmed based on manufacturing type or tuned at an initial time of system 400 operation based on a calibration procedure. Alternatively, the $D_{REF}$ value may be changed dynamically throughout system operation.

As indicated, the pixel array 410 may include a plurality of pixel elements that generate an electrical output in response to incident energy (e.g., light, x-rays, etc.). The pixel circuits may be organized into a regular array of addressable pixel circuits, for example, a Cartesian or hexagonal grid. For purposes of the present discussion, it is convenient to consider the arrays as including a variety of pixels in columns and rows. Each pixel p(x,y) may include TFT components that may generate a charge when excited by incident radiation. For example, x-rays illuminating on a pixel p(x,y) may generate the charge $C_{x,y}$. The amount of illumination may cause a corresponding variation in output charge (i.e., increasing illumination leads to increasing charge). When a pixel p(x,y) is addressed, it may output its charge $C_{x,y}$ to the sampling stage 420. During operation, a selected pixel p(x,y) may be addressed twice—once immediately after the pixel is reset to output a reset level and a second time after an exposure period to output the signal level.

In an embodiment, the pixel array 410 may be provided on a substrate separate from other components (e.g., sampling stage 420 and ADC stage 450). Such an implementation may be appropriate for an X-ray sensor system. The sampling stage 420 and ADC stage 450 may be provided in a common IC to each other. Alternatively, in another embodiment, the pixel array 410 may be provided on a common IC substrate as other components, which may be appropriate in a digital camera embodiment.

The sampling stage 420 may receive the input charge $C_{x,y}$ and may sample/accumulate the charge to generate a corresponding input voltage $V_{x,y}$ twice at different times for correlated double sampling. The samples may be stored as CDS1 and CDS2. CDS1 may correspond to a sampling time of known conditions (e.g., reset time), and CDS2 may correspond to a sampling time of unknown conditions (e.g., sensor reading).

The sampling stage 420 may include an integrator 422, integrating capacitor 424, reset switch, an optional output resistor 428, sampling capacitors 430, 432 and a digital to analog converter ("DAC") 440. The integrator 422 may have an input $C_{x,y}$ coupled to the pixel array 410 and a second input coupled to the DAC 440. The integrating capacitor 424 may be coupled to an output and an input of the integrator 422 in feedback configuration. The integrating capacitor 424 may be provided as a variable capacitor. The reset switch 426 may be coupled across the feedback capacitor. The output resistor 428 may be coupled between an output of the integrator 422 and first terminals of the storage capacitors 430, 432. Second terminals of the storage capacitors 430, 432 may be connected to ground. The first terminals of the storage capacitors 430, 432 may be connected to an output of the sampling stage 420 via sampling switches 434, 436.

The sampling stage 420 may receive input charges $C_{x,y}$ from the pixel array 410 at different times for correlated double sampling and may sample/accumulate the charge to generate a corresponding input voltage $V_{x,y}$. The samples may be stored respectively as CDS1 and CDS2 on the capacitors 430, 432. CDS1 may correspond to a sampling time of known conditions (e.g., reset time), and CDS2 may correspond to a sampling time of unknown conditions (e.g., sensor reading). The reset switch 426 may reset the integrating capacitor 424 in between sampling operations.

The storage capacitors 430, 432 may store the accumulated voltage for samples CDS1 and CDS2 respectively. Typically, the storage capacitors 430, 432 will have common capacitances. Sampling switches (not shown) may connect the capacitors 430, 432 to the output resistor 428 at appropriate times to capture the CDS1, CDS2 voltages on the respective capacitors. In an embodiment, an output resistor 428 may be provided that, working in conjunction with capacitance of the storage capacitors 430, 432, may form RC filters to reduce high-frequency noise. The output resistor 428 may be provided as a variable resistor, which may be programmed at run time to balance fast settling versus low noise advantages.

The DAC 440 may generate an analog reference voltage $V_{REF}$ based on the digital control signal $D_{REF}$. The $V_{REF}$ voltage may be applied by the integrator 422 as a resetting voltage. The DAC may be an M bit DAC (e.g., 6 bit), which is responsive to an M bit input code to generate any one of $2^M$ discrete voltages for use within the sampling stage 420.

In an embodiment, the ADC stage 450 may include a pair of sample and hold amplifiers ("SHA") 456, 458, a pair of capacitors 452, 454, and a differential ADC 460. The capacitors 452, 454 each may be provided in feedback configuration about a respective SHA 456, 458. The ADC stage 450 may receive the CDS1 and CDS2 samples from the sampling phase 420 and may convert the difference between the samples, ΔCDS, directly to a digital value in a single conversion operation. The SHAs 456, 458 may buffer CDS1 and CDS2 voltages that are output respectively from the sampling stage 420. A pair of storage capacitors 452, 454 respectively may store the samples CDS1 and CDS2. In an embodiment, the ADC stage storage capacitors 452, 454 and the sampling stage capacitors 430, 432 may be provided as common devices.

The input voltage $V_{x,y}$ from the pixel array 410 may vary over several phases of operation. In a first phase, $V_{x,y}$ may be at a reset level representing a voltage of a pixel prior to exposure to incident energy. In another phase, $V_{x,y}$ may be at signal level representing a voltage of the same pixel after having been exposed to incident energy. Other phases may be required to address different pixels within the array.

In an ideal case, the reset values of all pixels would match a common reference voltage. In practice, however, device mismatches and other variations within the pixel array 410 may cause pixel-to-pixel variations among the reset values of the different pixels. Such variations also would cause pixel-to-pixel variations among the signal values of the pixels if the pixels received common levels of incident energy. Manufacturing variations among components in the signal chain from the pixel array 410 through to inputs of a differential ADC 460 of the ADC stage also may contribute signal mismatch between the reset and signal values.

FIG. 4 also illustrates structure of a differential ADC 460 in an embodiment of the present invention. The differential ADC 460 may receive the CDS1 voltage from the SHA 456 at a first input terminal (e.g., a negative terminal) and may receive the CDS2 voltage from the CDS2 voltage from the SHA 458 at another input terminal (e.g., a positive terminal). The differential ADC 460 may generate a digital output code in response to a difference between the CDS1 and CDS2 voltages.

The differential ADC 460 may be provided as a successive approximation register (SAR) ADC and may include a main capacitor array 464, a secondary capacitor array 462, a comparator 466 and a SAR register 468. The main capacitor array 464 may be connected to the second SHA 458 to receive the CDS2 signal. The secondary capacitor array 462 may be connected to the first SHA 456 to receive the CDS1 signal. Each of the capacitor arrays 462, 464 may include an array of binary weighted capacitors with switch controls (not shown) to include or exclude the capacitors from contributing to an output voltage from the respective array. Switches of the main capacitor array 464 may be controlled by a SAR code control signal stored by the SAR register 468. Switches of the secondary capacitor array 462 may be controlled by a $D_{REF}$ control signal that may correspond to the resetting voltage. The capacitor arrays 462, 464 also may receive reference voltages $REF_N$ and $REF_P$, which may correspond to the operating range of the ADC 460. For example, $REF_N$ may correspond to the lower end (e.g., 0.5 V) and REF may correspond to the upper end (e.g., 4.5 V) of the operating range.

The comparator 466 may generate digital output signals in response to voltages presented at its inputs by the main and secondary capacitor arrays 464, 462. The SAR register 468 may assemble a digital code from the comparator's outputs. Contents of the SAR register 468 (SAR code) may be fed back to the main capacitor array 464 as switch control signals as the differential ADC 460 cycles through bitwise trials.

The differential ADC 460 may operate on a bitwise trial and error basis that searches through candidate quantization levels of the input signal and converges upon a digital output $D_{OUT}$. For a given bit trial, control switches within the main capacitor array 464 may be set according to any previous bit trials (shown as the SAR code signal) and control switches in the secondary capacitor array 462 may be set according to the $D_{REF}$ signal. The control signals SAR code and $D_{REF}$ may cause the main and secondary capacitor arrays 464, 462 to output voltages to the comparator 466. The results of each bit trial as provided by the comparator 466 may be stored in the SAR register 468 and may be used to set switch values in the main capacitor array 464 for a subsequent bit trial. The bit trials may be performed iteratively until all bit positions are resolved. The bit trial results may be combined to generate a digital output $D_{OUT}$. $D_{OUT}$ may be a digital representation of the difference of the CDS voltages, ΔCDS. Hence, the differential ADC 460 may operate in a balanced fashion (typically, the CDS voltages are close in values) to provide CDS differencing that provides improved common-mode and reference noise rejection.

By performing CDS1 to CDS2 comparisons within the ADC, the design of FIG. 4 provides an architecture that rejects offsets induced by common path components. As indicated, component variations among the pixel circuits can cause pixel-to-pixel variations in the reset and signal levels that are generated by the pixel array. Further, component variations within the integrator 422 or feedback capacitor 424 can induce signal offsets in the reset and signal levels. The architecture of FIG. 4 also integrates the CDS operation with digitization and thereby rejects signal corruptions that might affect the CDS1 and CDS2 in common.

The differential ADC 460 may perform bit trials for each bit position for the main capacitor array 464 starting with the MSB. For each bit trial, the main capacitor array's output may be compared to the respective nominal comparator operating point generated by the secondary capacitor array 462. The nominal comparator operating point may correspond to the difference between the CDS1 value and $V_{REF}$ (which is the analog version $D_{REF}$). The results of each bit trial as provided by the comparator 466 may be stored in the SAR register 468 and may be used to set switch values in the main capacitor array 464 for subsequent bit trials. The bit trials may be performed iteratively until the least significant bit is resolved. The bit trial results may be combined to generate a digital output $D_{OUT}$. $D_{OUT}$ may be a digital representation of the difference of the CDS voltages, ΔCDS.

The main capacitor array 464 output may be expressed as:

$$DAC = V_{REF} + \Delta CDS$$

where $V_{REF}$ is the analog version of the digital control signal $D_{REF}$ and $\Delta CDS$ is the difference between the CDS signals (CDS2–CDS1). The digital output $D_{OUT}$ of the ADC 460 may then be expressed as:

$$D_{OUT} = \frac{(DAC - REF_N)}{REF_P - REF_N} * 2^N$$

where DAC is the main capacitor array output, $REF_N$ is the lower end of the ADC operating range, $REF_N$ is the upper end of the ADC operating range, and N is the number of bits in the ADC (i.e., resolution). Hence, the ADC 260 may be operated in a balanced fashion (typically, the CDS voltages are close in values) to provide CDS differencing that provides improved common-mode and reference noise rejection. Furthermore, the system 400 may shift the digital output based on the ADC 460 operational range by "mapping" the expected range of the desired signal on the operational range.

The differential ADC 460 may be an N bit ADC (e.g., 16 bit), and the DAC 440 in the sampling stage 420 may be an M bit DAC (e.g., 6 bit). N may be greater than M (N>M).

Figure 5:
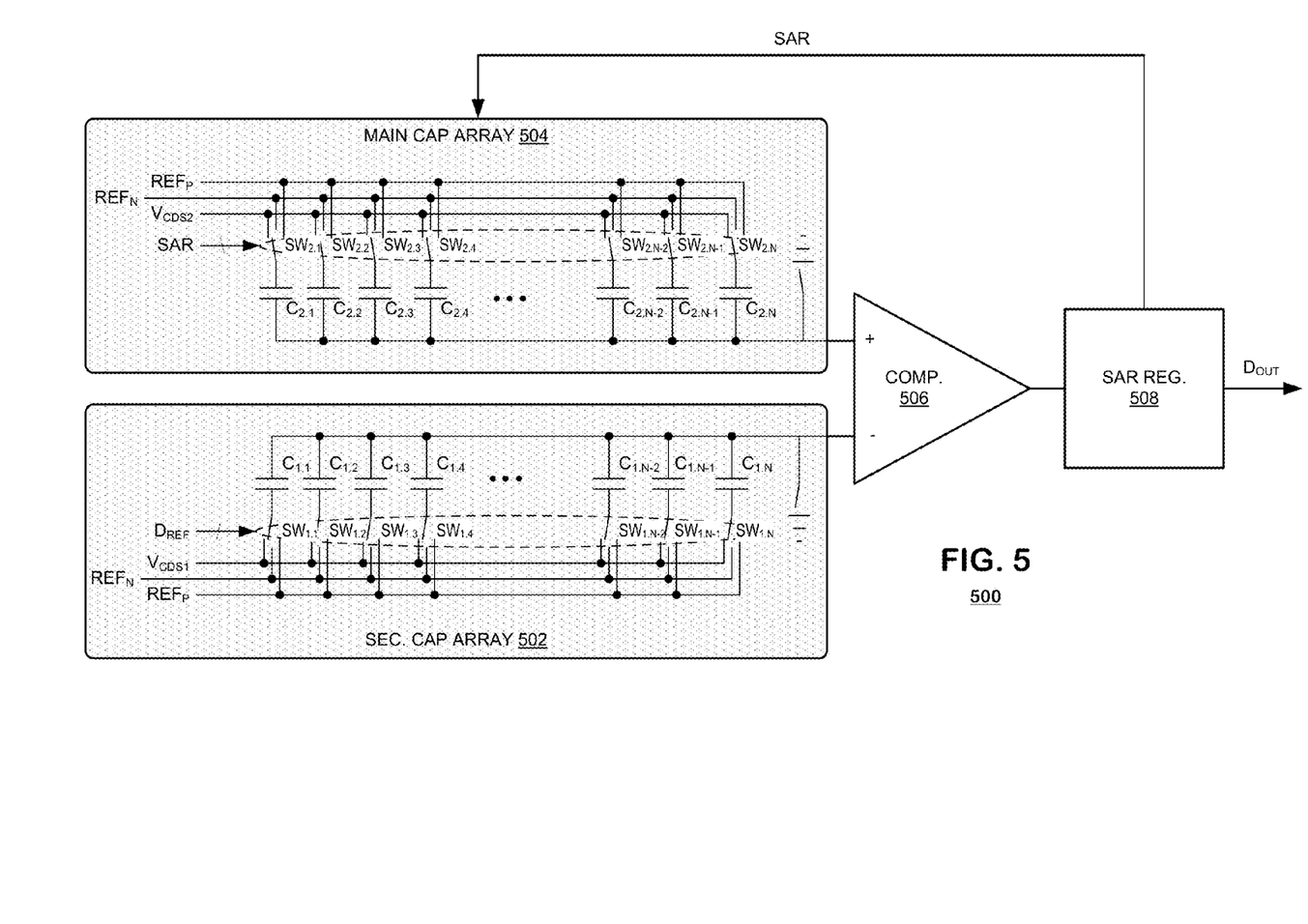
FIG. 5 is a diagram illustrating a successive approximation register analog to digital converter according to another embodiment of the present invention.

FIG. 5 is a simplified block diagram of a SAR ADC 500 according to an embodiment of the present invention. The SAR ADC 500 may accept the CDS2 input signal on a positive input of the ADC 460 (FIG. 4) and may accept the CDS1 input signal on a negative input of the ADC 460. The SAR ADC 500 may include a pair of capacitor arrays 502, 504, a comparator 506 and a SAR register 508. A secondary capacitor array 502 may include a set of binary weighted capacitors $C_{1.1}$-$C_{1.N}$ having first terminals (called "output" terminals, for convenience) coupled to a common output of the capacitor array 502. Second terminals ("input" terminals) of the capacitors $C_{1.1}$-$C_{1.N}$ may be coupled to a variety of voltage sources via respective switches $SW_{1.1}$-$SW_{1.N}$. The voltage sources may include CDS1, the voltage input to the ADC 500 from a prior stage, and reference voltages $REF_N$ and $REF_P$, which may define the operating range of the ADC 500. As indicated, $REF_N$ may correspond to the lower end (say, 0.5 V) and $REF_P$ may correspond to the upper end (say, 4.5 V) of the ADC's operating range. The switches SW1.1-SW1.N may be controlled by respective bit positions of a control signal $D_{REF}$, which may vary in correspondence with bit trials as the SAR ADC 500 performs them.

A main capacitor array 504 may include a set of binary weighted capacitors $C_{2.1}$-$C_{2.N}$ having first terminals ("output" terminals) coupled to a common output of the main capacitor array 504. Second terminals ("input" terminals) of the capacitors $C_{2.1}$-$C_{2.N}$ may be coupled to a variety of voltage sources via respective switches $SW_{2.1}$-$SW_{2.N}$. The voltage sources may include CDS2, the voltage input to the ADC 500 from a prior stage, and the reference voltages $REF_N$ and $REF_P$, that are input to the secondary capacitor arrays 502. The switches $SW_{2.1}$-$SW_{2.N}$ may be controlled by respective bit positions of a SAR code control signal output from the SAR register 508, which may vary in correspondence with bit trials as the SAR ADC 500 performs them.

As in the prior embodiment, the comparator 506 may be a one bit comparator used in each bit trial. The SAR register 508 may store bit values output from the comparator 506 at each bit trial to build up a multi-bit code. During operation, the comparator's bit decisions may be stored at respective bit positions of the ADC's output code $D_{OUT}$. The control signal SAR code also may be revised as the comparator's bit decisions build up the output code $D_{OUT}$.

As indicated, the control signal $D_{REF}$ may correspond to the resetting voltage used in a preceding sampling stage 420 and may be programmable to vary with TFT characteristics of circuitry in the pixel array 410. In an embodiment, the first number (M) of switches $SW_{1.1}$-$SW_{1.M}$ within the secondary capacitor array 502 may be set based on the $D_{REF}$ value used in the preceding sampling stage. Hence the secondary capacitor array 502 may be chosen to match the signal span of the ADC 500 to the anticipated CDS signal voltages.

Figure 6:
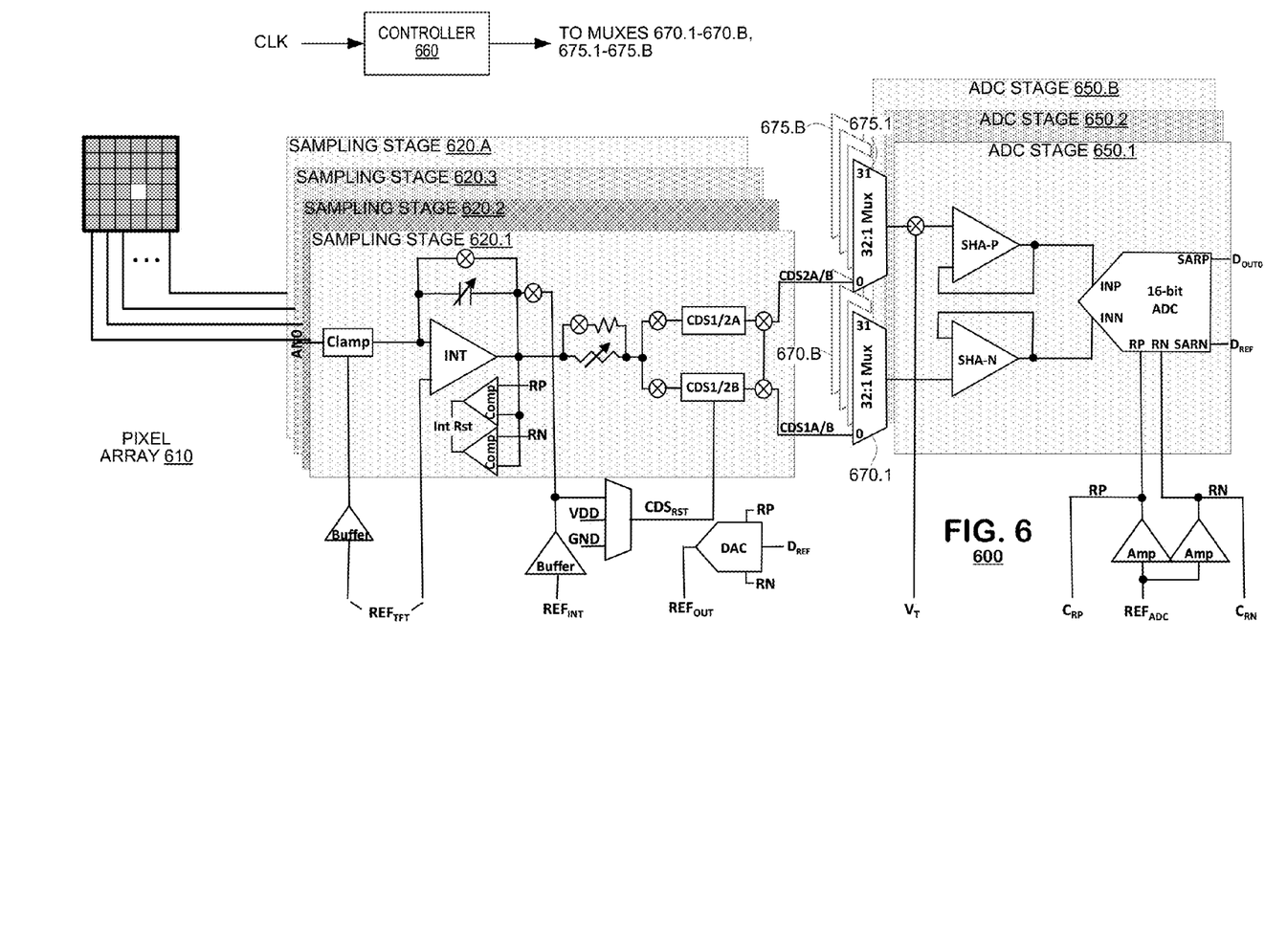
FIG. 6 is a diagram illustrating a sensor processing system according to a further embodiment of the present invention.

FIG. 6 illustrates a sensor processing system 600 according to another embodiment of the present invention. The system 600 may include a pixel array 610, a plurality of sampling stages 620.1-620.A, a plurality of ADC stages 650.1-650.B, a controller 660 and multiplexers 670.1-670.B, 675.1-675.B. In the system 600 of FIG. 6(*a*), outputs of the pixel array 610 may be input to the sampling stages 620.1-620.A. There may be one sampling stage 620.1 for each output of the pixel array 610. Outputs of the sampling stages 620 may be input to a stage of multiplexers 670.1-670.B, 675.1-675.B. Outputs from the stage of multiplexers 670.1-670.B, 675.1-675.B may be input to a number B of ADC stages 650.1-650.B. In one embodiment, for example, a pixel array 610 may have 2,048 output conductors, which may be input to 2,048 sampling stages 620 (A=2,048) and multiplexed further to sixty-four (64) ADC stages 650.1-650.B (B=64) by the multiplexers 670.1-670.B, 675.1-675.B.

The sampling stages 620.1-620.A may be constructed according to any of the foregoing embodiments. Thus, the sampling stages 620.1-620.A may include integrators, integrating capacitors, reset switches and storage capacitors as in the foregoing embodiments. Each sampling stage 620.1, . . . , 620.A may have a pair of outputs CDS1/2A, CDS1,2B for outputs of the CDS1 and CDS2 signals respectively. In the sampling stage 620.1-620.A, one of the integrator's input REFTFT may be connected to REFOUT either on-chip or off-chip, so that the reset level of the system is defined by a digital code DREF The ADC stages 650.1-650.B also may be constructed according to any of the foregoing embodiments. The ADC stages 650.1-650.B may include SHAs and differential ADCs as discussed. Each ADC stage 650.1, . . . , 650.B may have an output for a respective digital output code $D_{OUT}$.

In an embodiment, the system 600 may operate in a pipelined fashion in which reset and signal values are output from A pixels of the array 610 to the sampling stages 620.1-620.A simultaneously. The CDS 1 and CDS2 values may be stored in the storage capacitors of the sampling stages 620 and be read out to the ADC stages 650.1-650.B in multiplexed fashion by the multiplexers 670.1-670.B, 675.1-675.B. Thus, CDS1, CDS2 voltages may be stored in one of the sampling stages 620.2 while an ADC stage 650.1 processes CDS1, CDS2 values from a neighboring sampling stage 620.1. In this manner, the ADC stage 650.1 may generate a sequence of output codes $D_{OUT}$ representing a corresponding sequence of converted pixel data. The controller 660 may include a state machine to manage operation of the multiplexers 670.1-670.B, 675.1-675.B to support stage-to-stage transfer.

The embodiment of FIG. 6, therefore, provides a parallel processing system 600 for reading data from a pixel array 610 and digitizing it. As discussed in the foregoing example, the system 600 may include a predetermined number (say, 2,048) sampling stages 620 and another predetermined number (say, 64) ADC stages 650. When manufactured as an integrated circuit, manufacturing aberrations may induce offset errors among the parallel sampling stages 620, due to, for example, voltage offsets present among the 2,048 integrators 222 (FIG. 2) of the sampling stage 620. Similar manufacturing errors may induce differences in operation among the SHAs 256, 258 (FIG. 2) of the ADC stages 650. These differences in operation may introduce signal errors to pixel data as they are carried through the sampling stage 620 and ADC stage 650.

The foregoing embodiments of the present invention, however, can reduce effects of such aberrations in processing systems. By propagating reset and signal values through common signal paths, voltage offsets and other sources of signal corruption may be applied uniformly to the reset and signal values and may be canceled at the differential ADC 250 (FIG. 2) when the signals are digitized. Thus, even if differences in operation are present among the integrators 222 of the sampling stage 220, those differences may be canceled at the differential ADC 250. Indeed, the differential ADC 250 may cancel any signal corruptions that are introduced in common to the reset and signal value by the pixel array 610 or by signal processing circuits between the array 610 and the ADC's inputs.

The CDS processing techniques described herein may be extended to biosensor applications (e.g., micro-arrays), capacitor sensor applications, MEMS sensor applications, micro-machined applications, and temperature sensor applications.

Several embodiments of the present invention are specifically illustrated and described herein. However, it will be appreciated that modifications and variations of the present invention are covered by the above teachings. Other implementations are also within the scope of the present invention.

In other instances, well known operations, components and circuits have not been described in detail so as not to obscure the embodiments. It can be appreciated that the specific structural and functional details disclosed herein may be representative and do not necessarily limit the scope of the embodiments.

We claim:

1. Apparatus for performing correlated double sampling, comprising:
    a signal sampling stage comprising an amplifier with feedback capacitor and a pair of storage capacitors coupled to an output of the amplifier, the storage capacitors to store signal and reset values from a sensor respectively,
    a differential analog to digital converter (ADC) having a pair of inputs coupled respectively to storage capacitors of the signal sampling stage,
    a register to store a programmable value representing a nominal reset voltage,
    and a digital to analog converter having an input coupled to the register and an output coupled to the amplifier of the signal sampling stage.

2. The apparatus of claim 1, wherein the differential ADC is part of a circuit stage that further comprises a pair of sample and hold amplifiers (SHA), one SHA provided on each input of the differential ADC and coupled to a respective storage capacitor of the signal sampling stage.

3. The apparatus of claim 1, wherein the differential ADC is a successive approximation register ADC and comprises:
    first and second capacitor arrays coupled respectively to one of the storage capacitors of the signal sampling stage,
    a comparator having inputs coupled respectively to outputs of the first and second capacitor arrays, and
    a register to store bit decisions of the comparator in respective bit positions thereof.

4. The apparatus of claim 1, further comprising a multiplexer provided between an output of the sampling stage and inputs of the differential ADC.

5. The apparatus of claim 1, further comprising a pixel array having an output coupled to the sampling stage.

6. The apparatus of claim 5, wherein the pixel array, the sampling stage and the differential ADC are provided on a common integrated circuit.

7. The apparatus of claim 5, wherein the sampling stage and the differential ADC are provided on a common integrated circuit, separate from the pixel array.

8. Apparatus for performing correlated double sampling, comprising:
    a signal sampling stage comprising a plurality of sampling circuits, each circuit comprising:
        an amplifier with feedback capacitor, and
        a pair of storage capacitors coupled to an output of the amplifier, the storage capacitors to store signal and reset values from a sensor respectively; and
    a conversion stage comprising a plurality of differential analog to digital converters (ADCs) having a pair of inputs;
    a multiplexing stage provided between the signal sampling stage and the conversion stage comprising multiplexers to couple the storage capacitors of the signal sampling stage to inputs of the ADCs in response to a control signal;
    a register to store a programmable value representing a nominal reset voltage; and
    a digital to analog converter having an input coupled to the register and an output coupled to amplifier(s) of the signal sampling stage,
    wherein the number of sampling circuits is greater than the number of ADCs.

9. The apparatus of claim 8, wherein the conversion stage further comprises, for each differential ADC, a pair of sample and hold amplifiers (SHA), one SHA provided on each input of the differential ADC and coupled to a respective storage capacitor of the signal sampling stage.

10. The apparatus of claim 8, wherein the differential ADC is a successive approximation register ADC and comprises:
    first and second capacitor arrays coupled respectively to one of the storage capacitors of the signal sampling stage,
    a comparator having inputs coupled respectively to outputs of the first and second capacitor arrays, and
    a register to store bit decisions of the comparator in respective bit positions thereof.

11. The apparatus of claim 8, further comprising
    a pixel array having a plurality of outputs,
    an input multiplexer stage coupling outputs of the pixel array to inputs of the sampling stage, wherein a number of pixel array outputs is greater than a number of sampling circuits.

12. The apparatus of claim 11, wherein the pixel array, the sampling stage and the conversion stage are provided on a common integrated circuit.

13. The apparatus of claim 11, wherein the sampling stage and the conversion stage are provided on a common integrated circuit, separate from the pixel array.

14. A method for performing correlated double sampling, comprising:
    reading a reset value from a sensor circuit to a first storage device via a sampling system that uses a stored programmable value representing a nominal reset voltage for sampling,
    reading a signal value from the sensor circuit to a second storage device via the sampling system,
    generating a digital code representing an output value of the sensor circuit from a comparison of the reset value and the signal value, and using the stored programmable value representing the nominal reset voltage, the comparison being performed by a common element that performs the generating.

15. The method of claim 14, wherein reading the reset value and reading the signal value includes amplifying the signals.

16. The method of claim 14, further comprising storing the reset value in the sampling system and storing the signal value in the sampling system.

17. The method of claim 14, further comprising integrating a first signal to generate the reset value and integrating a second signal to generate the signal value in the sampling system.

* * * * *